United States Patent
Ellison

(10) Patent No.: US 7,066,660 B2
(45) Date of Patent: Jun. 27, 2006

(54) OPTOELECTRONIC PACKAGING ASSEMBLY

(75) Inventor: Thomas L. Ellison, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 77 days.

(21) Appl. No.: 10/741,644

(22) Filed: Dec. 19, 2003

(65) Prior Publication Data
US 2005/0047730 A1    Mar. 3, 2005

Related U.S. Application Data

(60) Provisional application No. 60/499,049, filed on Aug. 29, 2003.

(51) Int. Cl.
*G02B 6/36* (2006.01)
(52) U.S. Cl. .......................... 385/92; 385/93; 398/141; 174/52.5
(58) Field of Classification Search ............ 385/88–94; 398/141–150; 257/81, 99, 100, 433, 434, 257/678, 698, 89; 361/728–745, 752–759; 174/52.1–52.5
See application file for complete search history.

(56) References Cited

U.S. PATENT DOCUMENTS

| | | |
|---|---|---|
| 5,953,355 A | 9/1999 | Kiely et al. |
| 6,567,435 B1 | 5/2003 | Scott et al. |
| 6,632,029 B1 | 10/2003 | Williamson, III et al. |
| 6,670,599 B1 | 12/2003 | Wagner et al. |
| 6,867,368 B1 * | 3/2005 | Kumar et al. .............. 174/52.5 |

\* cited by examiner

*Primary Examiner*—Phan Palmer
(74) *Attorney, Agent, or Firm*—Workman Nydegger

(57) ABSTRACT

An optoelectronics packaging assembly is provided having a ceramic base on which is connected an optoelectronics device. The optoelectronic device is maintained in an enclosure formed by a housing, the base and/or other structures. The packaging assembly includes means for placing the base and the optoelectronics device in electrical communication with an external component, for example, a printed circuit board. The means include solder balls, J-shaped leads, bent leads, and electrical pads.

3 Claims, 11 Drawing Sheets

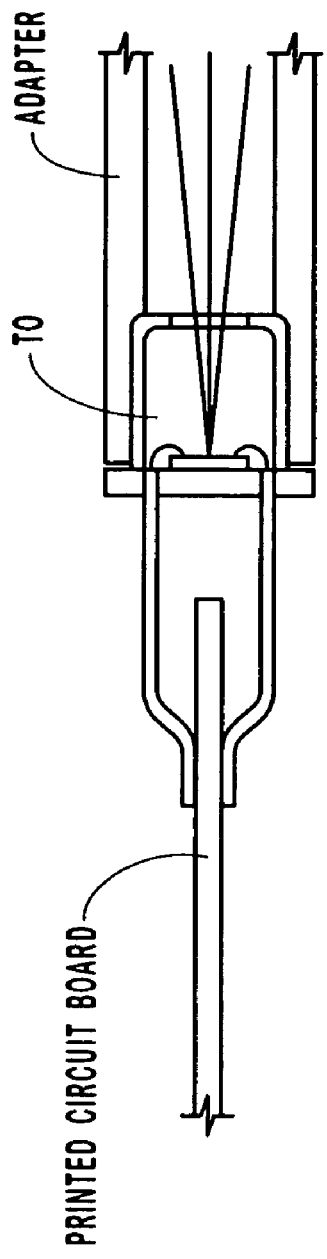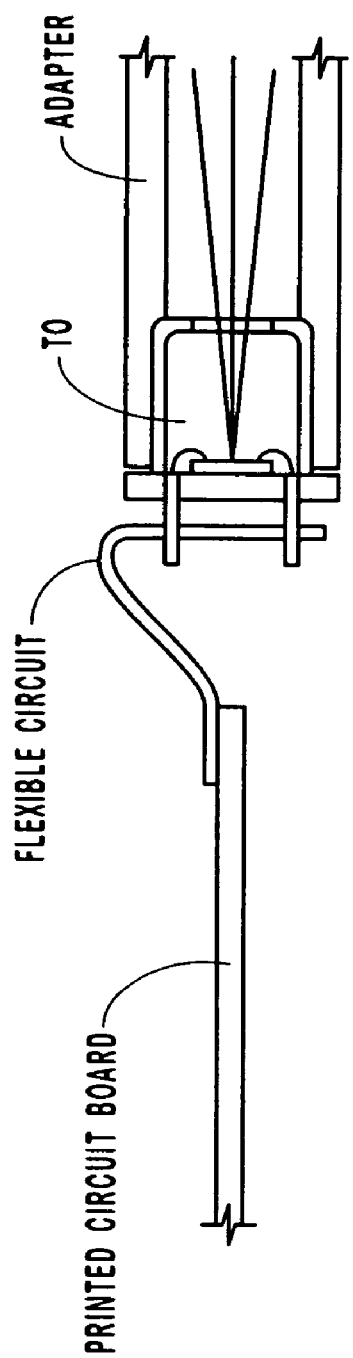

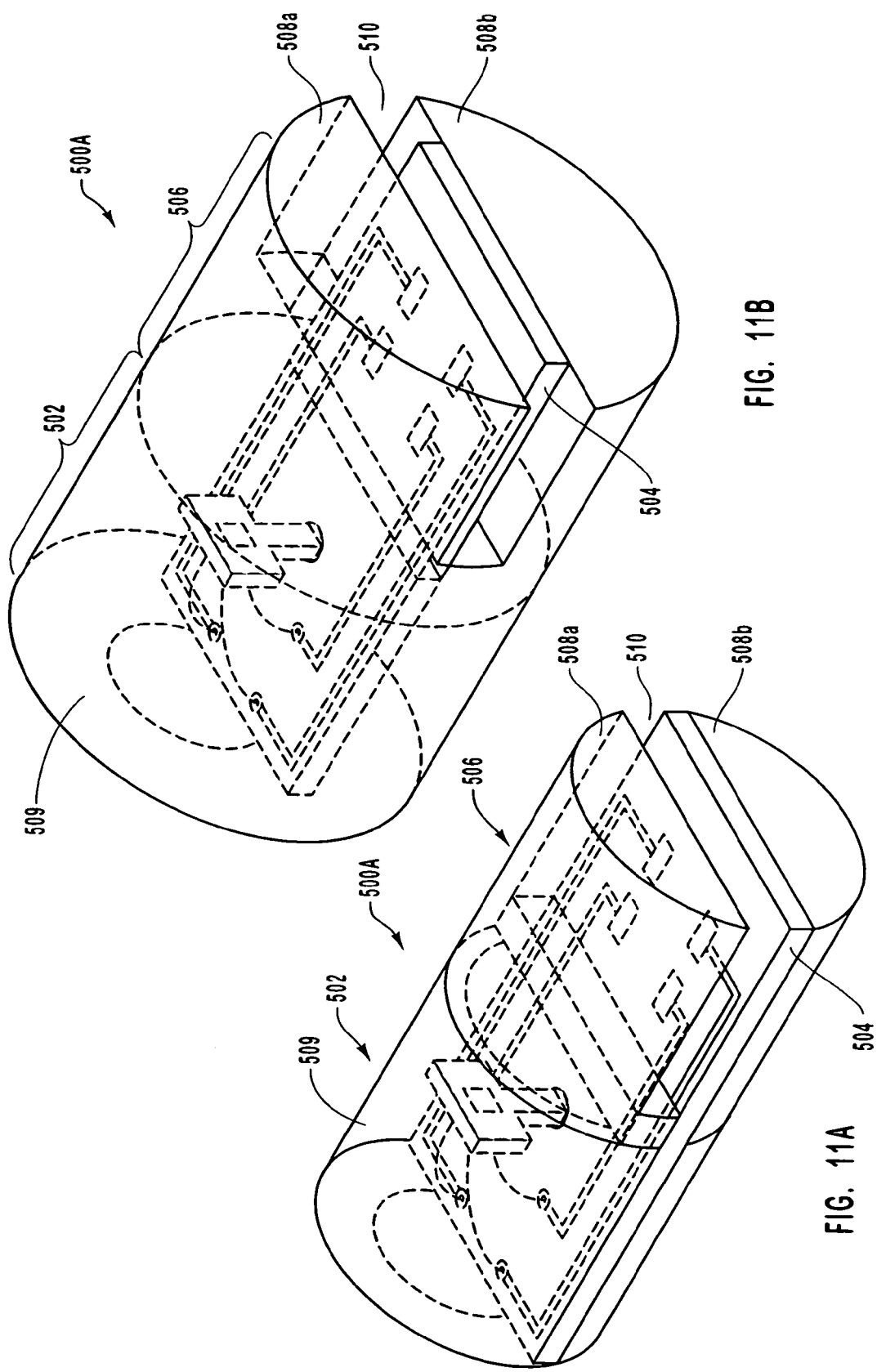

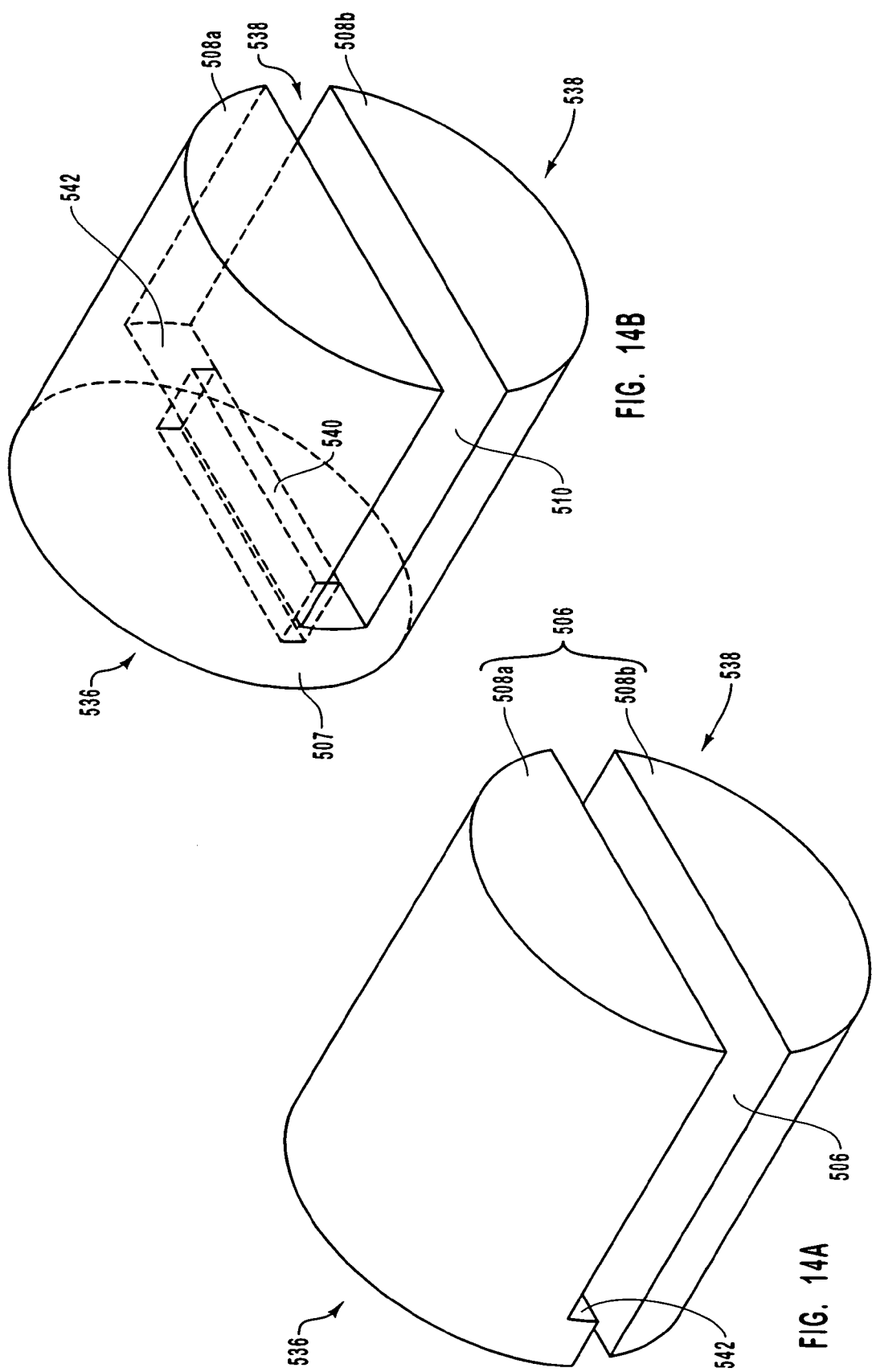

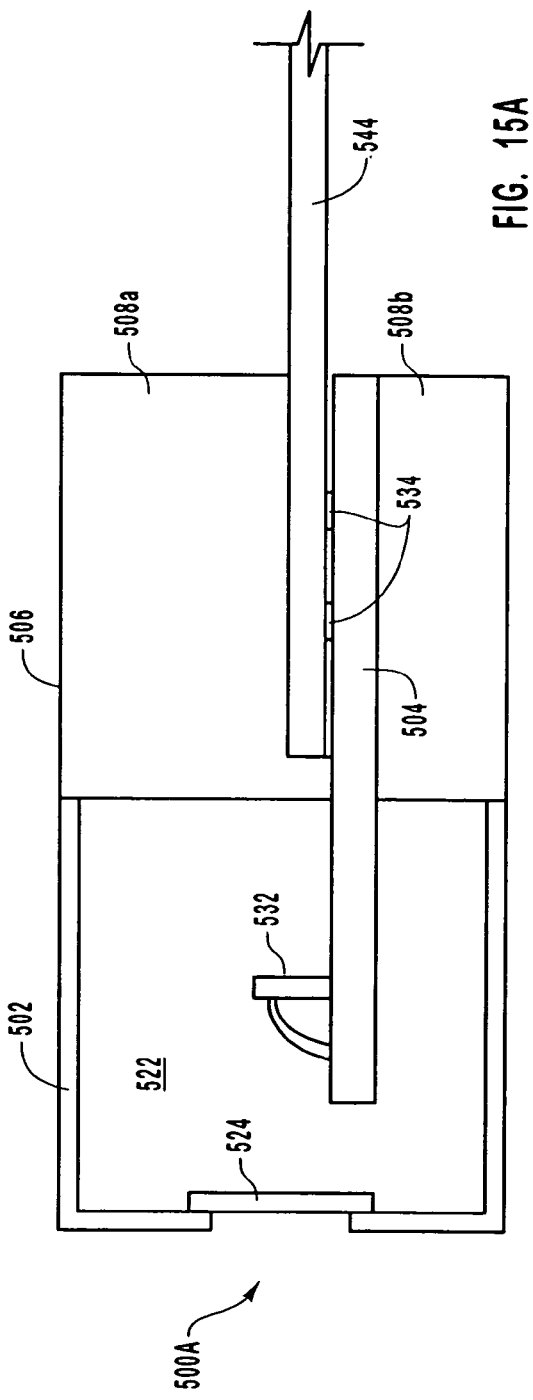
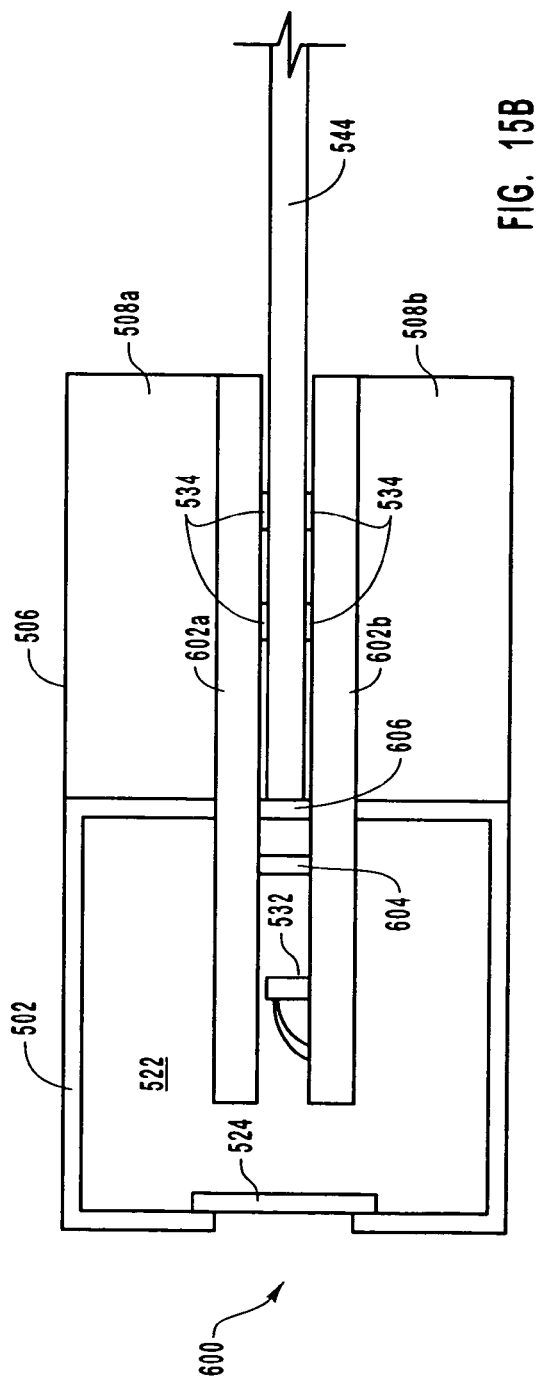
FIG. 15A
FIG. 15B

OPTOELECTRONIC PACKAGING ASSEMBLY

RELATED APPLICATIONS

This application claims priority to and benefit of U.S. Provisional Patent Application Ser. No. 60/499,049, filed Aug. 29, 2003, entitled "Optoelectronic Packaging Assembly" which patent application is incorporated herein by reference in its entirety.

BACKGROUND OF THE INVENTION

1. The Field of the Invention

The present invention relates to optoelectronic devices and systems. In particular, the present invention relates to a novel packaging assembly for an optoelectronic device for use with optoelectronic devices and systems.

2. The Relevant Technology

Fiber-optic and optoelectronics are an important aspect of modern networking circuits because they allow for efficient, accurate and rapid transmission of data between various components in the network system. As with the design of most systems, design considerations often determine the extent of use of a fiber optic system. For example, the size and modularity of components or devices must often be balanced against the need for additional space to accommodate heat dissipation and circuit monitoring components. While it is desirable to minimize a component's size, some design considerations have previously limited this minimization due to their inherent characteristics. For example, some optoelectronic components generate large amounts of heat which becomes more difficult to dissipate as the size of the component becomes smaller. Further, as the component becomes smaller, there is less space available for mounting and connecting additional components thereto.

Modular components are desirable in fiber optic systems to reduce the cost of manufacturing the system, which cost increases the more customized the system becomes. An example of a modular component is a transceiver. Transceivers usually include an input receiver optical subassembly (ROSA) and an output transmitter optical subassembly (TOSA). The ROSA comprises a photodiode for detecting optical signals and sensing circuitry for converting the optical signals to digital signals compatible with other network components. The TOSA comprises a laser for transmitting optical signals and control circuitry for modulating the laser according to an input digital data signal. The TOSA has an optical lens for collimating the light signals from the laser of the TOSA to an optical fiber. Additionally, the transceiver includes pluggable receptacles for optically connecting the TOSA and the ROSA with other components within a fiber optic network. The transceiver often includes an electronic connector for connection to electrical components of the computer or communication device with which the transceiver operates (a "host system").

The design of the transceiver, as well as other modular components within the fiber optic system, is preferably standards-based, such that components can be connected without significant customization. The standard defines various characteristics such as size, power consumption, connector configuration, etc. When designing components to operate within a particular standard, attention must be given to what components are selected and how they are configured so as to not exceed the rated power consumption. These components are constrained by principles of semiconductor physics to work preferentially in a certain temperature range. Factors such as power dissipation, size and materials uniquely determine the operating temperature of the component for given ambient conditions, such as ambient temperature, airflow, etc. The resulting operating temperature determines the types of optical and electronic devices that can be successfully operated within the component.

The photodiode in the ROSA and the laser in the TOSA are examples of optoelectronic devices. Generally, these optoelectronic devices are sensitive electrical devices which require protection. As such, these optoelectronic devices are usually manufactured in packaging assemblies. One such packaging assembly is known as a transistor-outline header or transistor-outline package, referred to herein as a TO package or TO can. TO packages are widely used in the field of optoelectronics, and may be employed in a variety of applications. As such, TO packages are often standardized to facilitate their incorporation into components such as transceivers. The TO packages protect the sensitive electrical devices contained therein and electrically connect such devices to external components such as printed circuit boards ("PCB").

With respect to their construction, the TO packages often include a cylindrical metallic base with a number of conductive leads extending completely through, and generally perpendicular to, the base. The size of the base is often sized to fit within a specific TO standard size and lead configuration, examples of which include a TO-5 or TO-46. The leads are usually hermetically sealed in the base to provide mechanical and environmental protection for the components contained in the TO package, and to electrically isolate the conductive leads from the metallic material of the base. Typically, one of the conductive leads is a ground lead that may be electrically connected directly to the base.

Various types of electrical devices are mounted on one side of the base and connected to the leads. Generally, a housing is used to enclose the side of the base where such electrical devices are mounted, so as to form a chamber that helps prevent contamination or damage to those electrical device(s). The design of the TO package depends on the optoelectronic device being mounted on the base and the modular component to which the TO package will be used. By way of example, in applications where the optoelectronic device mounted on the base is an optical device, the housing is at least partially transparent so to allow an optical signal generated or received by the optical device to be transmitted to or from the TO package. These optical TO packages are also known as window cans.

Although TO packages have proven useful, a number of disadvantages exist when implementing these packages in fiber-optic or optoelectronic systems. Some of such problems relate specifically to the physical configuration and disposition of the conductive leads in the base of the TO package. One disadvantage is that the diameter of the base of the TO package is typically small and, thus, limits the number and size of conductive leads that can be disposed therethrough. The number and capacity of leads in a TO package is sometimes referred to as the input/output ("I/O") density. Therefore, in TO packages, the I/O density is relatively small. Thus, while the diameter of the base can be increased, thus increasing the I/O density, the extent of increase in base diameter is sharply limited, if not foreclosed completely, by form factors, dimensional requirements, and space limitations associated with the electronic device for which the TO package is to be employed.

Yet another disadvantage is that TO packages are not particularly useful for those complex electrical devices that require many isolated electrical connections to function properly. In addition, dimensional requirements and space limitations for complex electrical devices further constrain the size and shape design of the package, making TO packages less than ideal for these complex electrical devices.

Still another disadvantage is that some complex electrical devices require additional ancillary electrical devices in order to function properly. Examples of ancillary electrical devices include resistors, capacitors, inductors, and thermoelectric coolers. The size and configuration of conventional TO packages limit the number of ancillary electrical devices which can be mounted on the base.

Furthermore, problems can exist in connecting the TO package to other components of the circuitry. The conductive lead configuration of a conventional TO packages limits how the package, and ultimately, the modular component to which it is associated, is connected to other components of the system, e.g., the PCB. TO packages have conventionally been connected to a PCB using through-hole technology. That is, holes are drilled through the PCB corresponding to each lead. The leads are then disposed through the holes and welded, soldered or otherwise connected to the PCB. This configuration works well when the base of the TO package can be parallel to the PCB. However, where it is desirable to position the TO package in any other direction, the TO packages do not connect as easily to the PCB.

Additionally, in printed circuit board designs which implement primarily surface mount technology structures, it is an inconvenience to have to adapt or compromise the design in order to consider through-hole mount technology structures. Such considerations generally increase the cost of manufacture.

As shown in FIG. 1, the TO package is positioned on its side such that the base is perpendicular to the PCB. This configuration may be desirable where the optic window is disposed at the top of the can and the incoming or outgoing optical signal is coming from the side (i.e., a side-emitting configuration). The leads of the TO package straddle the outer edge of the PCB such that some of the leads are on the top surface of the PCB and some of the leads are on the bottom surface of the PCB. The leads are then bonded to the PCB. The housing portion of the TO package may be disposed in a TOSA/ROSA port to form a TOSA/ROSA subassembly which is attached to the housing or chassis of the electronic unit. However, the configuration of FIG. 1 is undesirable because the leads are unsupported between the base and the PCB and thus unable to withstand torque, gravitational, or other pressure or jostling which may be applied to the leads during normal use of the electronic unit. But the biggest disadvantage results from differences between the separation (pitch) of the through-hole leads exiting the TO can and the thickness of the printed circuit board. To form a strong solder joint, the leads should rest on the solder pads of the printed circuit board. Frequently, because of the mis-match between the lead pitch and the thickness of the printed circuit board, the leads must be bent into a flattened "s" shape so they will lie parallel and against the pads of the printed circuit board. This requires either very specialized tooling or manual lead forming by operators. If done manually, the lead forming is frequently imperfect and irregular and the resulting solder joint can be of poor quality. The glass-to-metal seal on the TO can is also subject to cracking and damage from lead forming operations. In any event, these special lead forming operations add extra assembly cost as a result of having a less than desirable package for surface mounting on a printed circuit board.

As shown in FIG. 2, a TO package is positioned such that the base is perpendicular to the PCB. This configuration uses flexible circuit technology to connect the leads of the TO package to a PCB. That is, a flexible circuit is used to connect the leads to a surface of the PCB. The flexible circuits are delicate and easily damaged. Implementing flexible circuits adds significant cost to the assembly both in terms of extra materials and additional steps to attach the flexible circuit to the main printed circuit board.

In view of the foregoing, a need exists for a packaging assembly for optoelectronic devices that overcomes the above challenges.

BRIEF SUMMARY OF THE INVENTION

The present invention relates to optoelectronic packages or packaging assemblies that are configured to be electrically connectable to other components of a network system using surface mount technology. In particular, the packaging assemblies of the present invention are configured to be electrically connected to an external component, such as a printed circuit board. The packaging assemblies of the present invention are configured to house optoelectronic devices and to electrically connect the optoelectronic device to the external component. In addition, the packaging assembly can be mechanically connected to the external component. The structures used to connect the packaging assemblies to the external component may or may not be the same structures which mechanically connect the packaging assembly to the external component.

Optoelectronic devices of the present invention include, but are not limited to, laser diodes, Vertical Cavity Surface Emitting Lasers (VCSELs), Distributed Feedback lasers (DFB), Fabry-Perot semiconductor diode lasers, photodiodes, avalanche photodiodes, Light Emitting Diodes (LEDs), and the like. Optoelectronic devices generally include a die composed of, but not limited to, gallium arsenide or indium phosphide, having circuitry formed thereon which provides the functionality for the particular optoelectronic device. In one embodiment, the die may also have structures which assist in connecting the optoelectronic device to the structures of the packaging assembly.

In one embodiment, a die is attached to a metal post extending downwardly therefrom for connecting the optoelectronic device to the packaging assembly. The post serves further to assist in properly orienting a laser die with a window in the housing of the package so that the laser beam is aligned with the window.

The optoelectronic device is connected to a base to support and align the optoelectronic device. The base includes a first end, a second end, a top surface, and an opposing bottom surface extending between the first end and the second end. In one embodiment, the base is formed from a ceramic material, such as, but not limited to aluminum oxide ($Al_2O_3$), aluminum nitride (AlN) or beryllium oxide (BeO).

The base includes means for mechanically attaching the optoelectronic device thereto. The means for attaching the optoelectronic device to the base may include the same structures that serve to electrically connect the optoelectronic device to the base. In one embodiment, a through-hole, or via, is formed transversely through the base and is configured to receive the post containing the semiconductor die having the circuitry for the optoelectronic device formed thereon. In another embodiment, the base may be configured with a recessed or stepped region configured to receive the optoelectronic device.

Means for bonding the post to the base include, but are not limited to, soldering, brazing, epoxy, adhesive, and the like. In the embodiment where the optoelectronic device has a post for connecting to the base, the via can be metallized during the fabrication of the ceramic base to permit a brazing or soldering process to mechanically affix the post to the base. Other vias that may be formed in the base can likewise be metallized in order to place the optoelectronic device in electrical communication with other components of the packaging assembly.

In one embodiment, the optoelectronic device is mounted vertically with respect to the base such that the optoelectronic device is configured to receive or transmit signals through the side of the packaging assembly, known as an "edge-emitting" configuration for devices such as DFB or Fabry-Perot lasers. Alternatively, the optoelectronic device can be configured to lay horizontally such that the detection or transmission of optical signals occurs through the top or ceiling of the packaging assembly for devices such as the VCSEL laser.

Other electronic components may be disposed on the base which assist in the functional operation of the optoelectronic device or the packaging assembly. Such electronic components include, but are not limited to, resistors, capacitors, inductors, semiconductor die for signal amplification, and the like. Recessed or stepped regions may be formed in the base to connect the optoelectronic device and/or other electronic components thereto.

The base includes means for placing the optoelectronic device in electrical communication with the external component or printed circuit board. The means for placing the optoelectronic device in electrical communication or connection with the printed circuit board includes any metal, metal alloy, or other conductive structure which assists in directly or indirectly establishing an electrical pathway between the optoelectronic device and the external component.

In one embodiment, the means for placing the optoelectronic device in electrical communication with the printed circuit board includes a ball grid array. The ball grid array includes a plurality of solder bumps or solder balls, which are arranged on the bottom of the base. A plurality of through-holes or vias is transversely formed on the base during the fabrication of the base. Each via is configured to receive and/or attach to a solder ball. In one embodiment, the vias are metallized, which assists in bonding the solder balls to the base. Preferably, the vias are hermetically sealed to the base to provide mechanical and environmental protection for the optoelectronic devices contained in the packaging assembly.

After the optoelectronic device is mounted to the base, the cathode and anode portions of the optoelectronic device are connected to the base by wire bonding. Wire bonds extend from the optoelectronic device to wire bond pads formed on the base. The bonding wires can be wire bonded either thermally, ultrasonically, or thermosonically to the optoelectronic device and the bond pads. Metal traces are formed between the bond pads and the metallized vias during the fabrication of the base. Thus, the bonding wires, wire bond pads and metal traces complete the electrical pathway from the vias to the optoelectronic device in the embodiment where solder balls are implemented.

Another means for placing the optoelectronic device in electrical communication with an external component includes elongate leads extending from the base. The elongate leads replace the vias and solder balls. The elongate leads are connected to the metal traces to place the elongate leads in electrical communication with the optoelectronic device. In one embodiment, the elongate leads can be bent in a "J" shape so that the curved portion of the "J" shape can be connected to the printed circuit board via soldering, brazing, and the like. In another embodiment, the elongate leads are bent outwardly to form legs that are configured to connect to the external component. In yet another embodiment, means for placing the optoelectronic device in electrical communication with an external component includes electrical pads formed on the base. Preferably, the leads are insulated from coming in contact with the metal housing of the package.

The optoelectronic device is maintained in an enclosure to protect the optoelectronic device from harmful gases or other environmental concerns. The enclosure is formed generally from a housing and the base. In one embodiment, the housing has a rectangular configuration, having a top surface, front side, a rear side, a left side, and a right side such that the open bottom side of the housing is configured to rest on the base. Preferably, the base has a metallized perimeter which corresponds to the perimeter of the housing.

In another embodiment, the housing is configured to receive a first end of the base, in particular, the end of the base having the optoelectronic device. The housing thus has a slot at one end sized large enough to receive the base, which interface is sealed when the base is disposed in the housing, thus forming a hermetic enclosure. A receiving assembly is provided which has a first and second portion which form a gap therebetween. The gap is configured to receive the second end of the base and a portion of the external component. In one embodiment, the receiving assembly is formed as two discrete portions. Alternatively, the receiving assembly may be formed as an integral member having two portions forming a gap therebetween. In this embodiment, it is not required to bond the receiving assembly to the housing to form a hermetic enclosure since sufficient hermeticity is acquired by bonding the interface of the housing and the base.

In yet another configuration, the receiving assembly is part of the structure that forms the enclosure together with the housing and the base. In this embodiment, the housing has a can-like configuration in which the open end receives the end of the base having the optoelectronic device. The receiving assembly is bonded to the housing to form a hermetic enclosure together with the base.

In still another embodiment, the housing portion may be formed integrally with the receiving assembly. These last embodiments in which an end of the base is received in an enclosure of the housing may be advantageously implemented in center-line applications.

In still another embodiment, two bases may be implemented, one being bonded to the top portion of the receiving assembly and one being bonded to the bottom portion of the receiving assembly, wherein a portion of both of the bases are disposed within the housing and a portion of both of the bases disposed in the receiving assembly. Both of the bases may include structures for placing the optoelectronic device in electrical communication with an external component. For example, both bases may include bonding pads, metal traces, and electrical pads. In addition, a metallizing post may be disposed between and connect the two bases so that the two bases and placed in electrical communication.

The housing also includes a transparent optical portion or window disposed on one of the sides thereof. The window may be formed of glass or suitable plastic. Preferably, the interface between the window and the housing has a hermetic seal.

Means are provided for mechanically attaching the packaging assembly to the external component. In one embodiment, the means include support or connector tabs disposed on opposing sides of the housing and/or base. Means for mechanically attaching the packaging assembly to the external component may also include structures which form the means for electrically connecting the optoelectronic device to the external component.

Methods for preparing or assembling the packaging assembly of the present invention include preparing the base in the desired shape from ceramic material or other material. The base material is punched to form vias for connecting the optoelectronic device, or with recessed or stepped regions. In addition, base material is punched to form vias for the solder balls in embodiments where solder balls form the electrical connection between the base and external component. The base is then fired in a furnace.

The metal traces, vias and/or pads on both top surface (device side) and bottom surface (PCB side) of the base are all formed by printing ceramic metallizing paste on the ceramic prior to firing the ceramic.

The solder balls or lead system is then formed, which includes attaching solder balls or elongate leads to the base.

Finally, the optoelectronic device is attached to the post or other structure on the base. The optoelectronic device is wire bonded to the appropriate electrical connections on the base.

The housing is formed and placed over the optoelectronic device. In the embodiment where the housing and the base form the enclosure, the housing is bonded to the base. In the embodiment where other structures are required to form the enclosure, they are bonded together with the housing and the base as necessary.

The packaging assembly can then be bonded to an external component, such as a printed circuit board. Alternatively, the packaging assembly can be connected to a TOSA or ROSA port to form a TOSA or ROSA subassembly module. The TOSA or ROSA subassembly module can then be used to form a transceiver module. Additionally, the packaging assembly can be fitted with additional adapters to assist in connecting the packaging assembly to connect to the TOSA or ROSA port.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 1 illustrates a conventional TO can being connected to a printed circuit board;

FIG. 2 illustrates another method of attaching a conventional TO can to a printed circuit board using a flexible circuit;

FIGS. 11A and 11B illustrates additional embodiments of the packaging assemblies of the present invention having a center-lined configuration for connection to a TOSA/ROSA port;

FIGS. 14A and 14B illustrate the receiving assembly of the embodiments of FIGS. 11A and 11B in more detail;

FIG. 15A is cross-sectional view of one embodiment of a packaging assembly being connected to a printed circuit board according to the present invention; and FIG. 15B is yet another embodiment of packaging assemblies of the present invention, illustrating two bases.

DETAILED DESCRIPTION OF THE PREFERRED EMBODIMENTS

Figure 3:
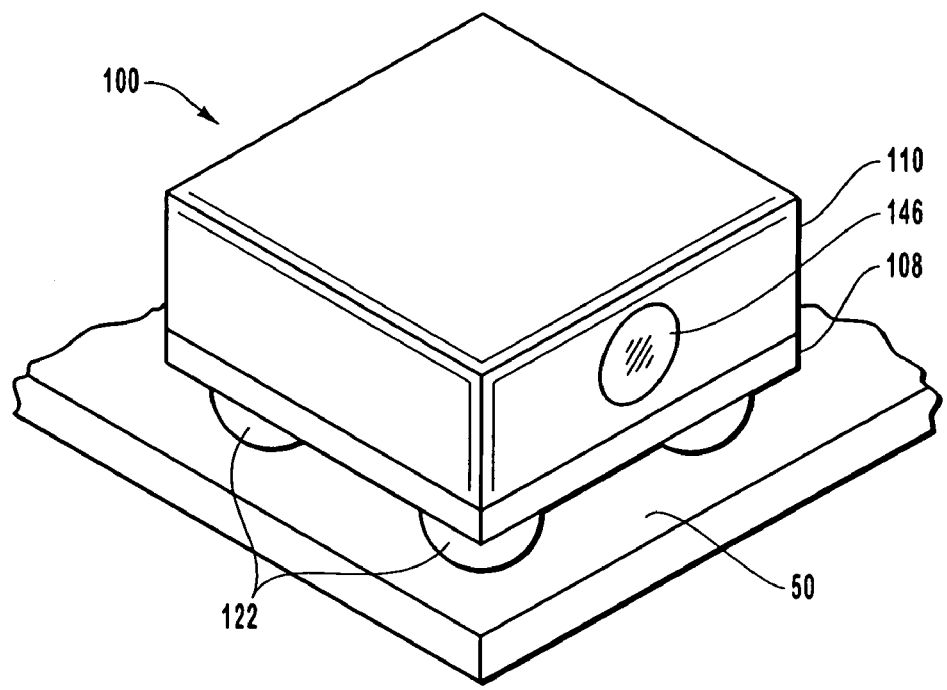
FIG. 3 is a perspective view of a packaging assembly according to embodiments of the present invention.

The present invention relates to optoelectronic packages or packaging assemblies that are configured to be electrically connectable to other components of a network system using surface mount technology. Referring to FIG. 3, an optoelectronic packaging assembly 100 is shown configured to be electrically connected to an external component. As used herein, the term "external component" refers to any component outside the structure of the packaging assembly 100. A printed circuit board 50 is an example of an external component and will be used herein for purposes of describing the features and advantages of the novel packaging assembly 100 of the present invention. Packaging assembly 100 houses an optoelectronic device, which optoelectronic device is configured to be electrically connected to printed circuit board 50 via packaging assembly 100. In addition, packaging assembly 100 can be mechanically connected to the printed circuit board 50.

As used herein, the term "electrically connected" or "electrically connectable" refers to the configuration where the optoelectronic device within the packaging assembly 100 is placed in electrical communication with an external component, such as, but not limited to, printed circuit board 50. The structures used to electrically connect packaging assembly 100, and hence the optoelectronic device contained therein, to an external component may or may not be the same structures which mechanically connect packaging assembly 100 to the external component.

Figure 4:
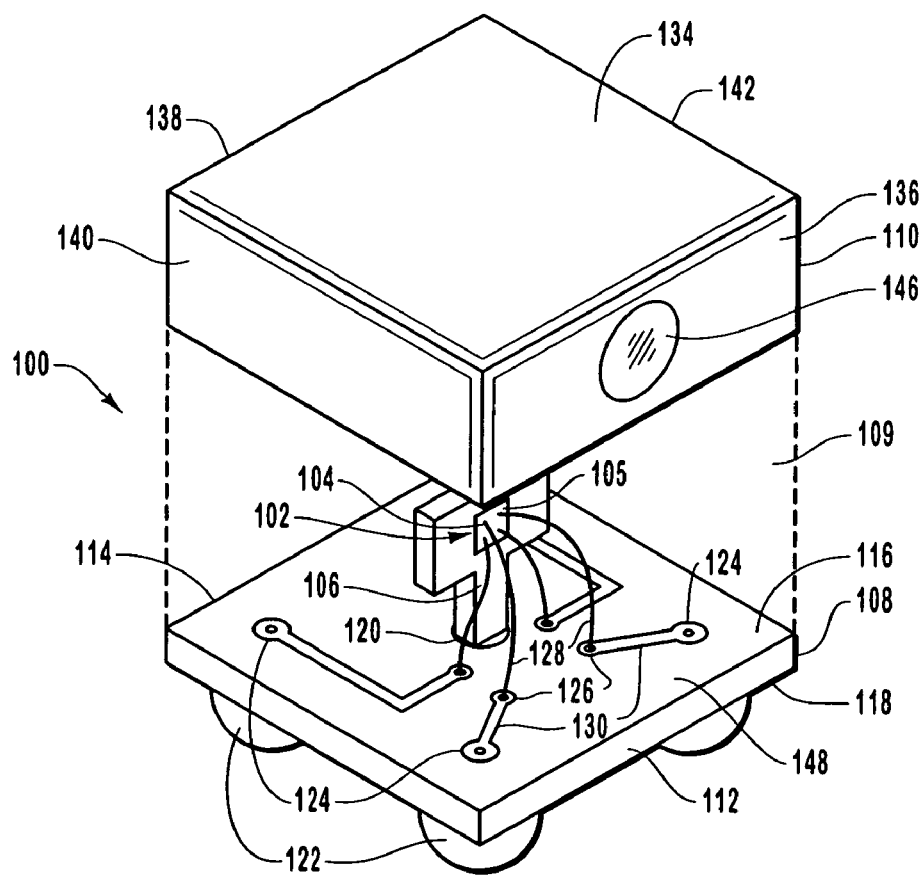
FIG. 4 is an exploded view of the embodiment of a packaging assembly of FIG. 3.

With reference to FIG. 4, packaging assembly 100 is configured to house one or more optoelectronic devices 102. As is generally required in semiconductor component packaging, packaging assembly 100 must generally have some sort of structure to protect the optoelectronic device 102 from physical and environmental abuse. As such, packaging assembly 100 includes an enclosure 109 for containing the optoelectronic device. Enclosure 109 is generally formed by a base 108, a lid or housing 110 and/or other structures.

Figure 5A:
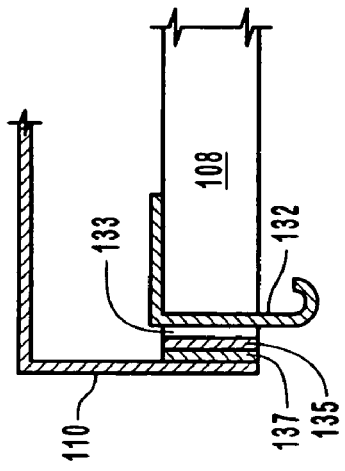
FIG. 5A is a cross-sectional view of a portion of the base of FIG. 5.
Figure 5:
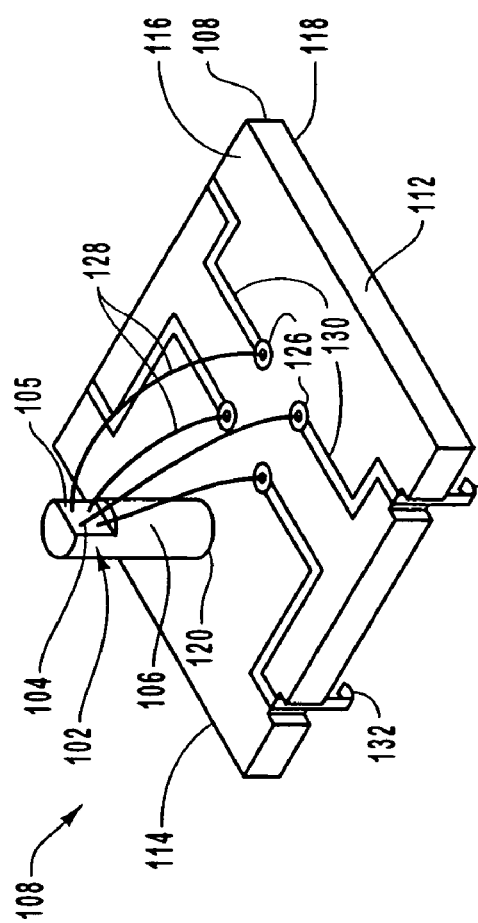
FIG. 5 is a perspective view of a base of another embodiment of the invention illustrating J-shaped leads.
Figure 6:
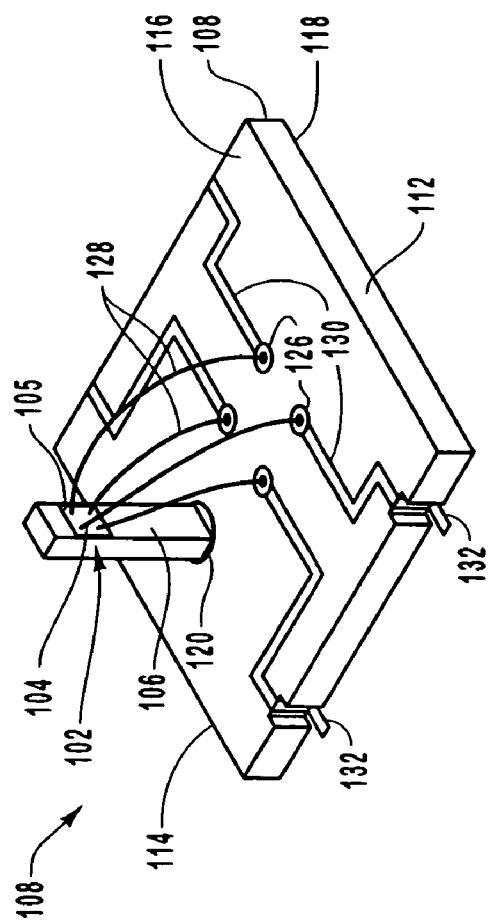
FIG. 6 is a perspective view of a base of yet another embodiment of the invention illustrating bent leads.

Optoelectronic devices 102 include, but are not limited to, laser diodes, VCSELs, DFBs, and Fabry-Perot lasers, photo diodes, avalanche photodiodes, LEDs, and the like. Optoelectronic devices 102 generally include a gallium arsenide or indium phosphide die 104 having circuitry 105 formed thereon which provides the functionality for the particular optoelectronic device. In one embodiment, the die 104 is mounted to a post 106 extending downwardly therefrom for connecting the optoelectronic device 102 to packaging assembly 100, which will be discussed below in further detail. The shape of post 106 may vary depending on the particular designs. Examples of configurations for post 106 are shown in FIGS. 4, 5 and 6, but are not limited thereto.

As shown in FIG. 4, base 108 includes a first end 112 and a second end 114. Base 108 also includes a top surface 116 and an opposing bottom surface 118 extending between first end 112 and second end 114. In one embodiment, the base is formed from a ceramic material. In one preferred embodiment, the ceramic material is aluminum oxide ($Al_2O_3$). Aluminum oxide is particularly preferred because it is hermetic and readily available, low in cost, and has a good thermal expansion coefficient. In another embodiment, the ceramic material comprises aluminum nitride (AlN), or beryllium oxide or beryllia (BeO). A ceramic material is desired for its hermeticity, low loss quality and long life characteristics. Ceramic materials are also able to withstand high operating temperatures and heat shock. The use of advanced ceramic materials, such as aluminum nitride and beryllia, allows packaging assembly 100 to achieve substantially lower thermal resistances between the optoelectronic devices inside the package and the exterior where heat is ultimately transferred. In a less preferred embodiment, plastic laminate substrates may be implemented in embodiments where hermeticity is not essential.

In the embodiment of FIG. 4, base 108 has a rectangular configuration. In one embodiment, the dimensions of base 108 are about 5–10 mm in length, about 5–10 mm in width, and about 3–5 mm in height. However, depending on the particular design, base 108 may have a circular, polygonal, oblong or other configuration.

Base 108 includes means for mechanically attaching the optoelectronic device 102 thereto. The means for attaching the optoelectronic device 102 to the base 108 may include the same structures that serve to electrically connect the optoelectronic device 102 to printed circuit board 50. In one embodiment, a through-hole or via 120 is formed transversely through base 108. Via 120 is configured to receive post 106. In some embodiments, for example where optoelectronic device 102 is a semiconductor laser, it is important for the optoelectronic device to be precisely positioned perpendicularly to base 108. To accurately position post 106 in via 120, the via may be stamped with a polygonal shape and post 106 may be configured with a corresponding polygonal shape which can be matingly disposed in via 120. Post 106 is disposed in via 120 and bonded thereto. Thus, the post 106 serves to assist in properly orienting a laser die with the package window so that the laser beam is aligned with the window. In the case of a VCSEL laser (where the light emerges from the top surface of the die), the post would allow parallel orientation of the die with the window. In the case of DFB or Fabry-Perot lasers (where the light emerges from the edge of the die), the post would allow the die to be oriented perpendicular to the window.

In one embodiment, stepped or recessed regions may be formed on base 108 configured to receive the die 104 in a horizontal or vertical position. These stepped or recessed regions may or may not implement post 106 for connecting thereto. This embodiment has the potential to reduce manufacturing steps, as described further below. The stepped areas and/or recessed areas also permit mounting other electrical components to base 108. The stepped and/or recessed regions allows the use of the shortest electrical interconnects, wire bonds for example, having improved electrical performance and characteristics. This also provides optical benefits by, for example, mounting an optoelectronic device 102 on a stepped region of the base 108 to align the active region of the optoelectronic device with the optical axis of the packaging assembly 100.

Means for attaching optoelectronic device 102 to base 108 include, but are not limited to, soldering, brazing, adhesive, epoxy and the like. In the embodiment where the optoelectronic device 102 is mounted on a post 106, the post is configured to fit in a via 120, the via can be metallized (e.g., by brazing or soldering) to place the optoelectronic device 102 in electrical communication with the other components of packaging assembly 100. In addition, metallizing via 120 assists to mechanically bond post 106 to base 108 and provide a gas tight hermetic seal, especially where the bonding and metallizing processes are similar. Via 120 is shown to be centrally formed in base 108. However, via 120 may be off-centered or disposed in any region of base 108.

In the embodiment of FIG. 4, the optoelectronic device 102 is mounted vertically and perpendicularly with respect to base 108. That is, the optoelectronic device is configured to receive or transmit signals through the side of packaging assembly 100. In the embodiment where the optoelectronic device is an optical receiver, this type of configuration is sometimes referred to as an "edge detecting" or "side-emitting" detector (e.g., DFB or Fabry-Perot lasers. Alternatively, the optoelectronic device can be configured to lay horizontally on base 108 such that the detection or transmission of optical signals occurs through the top or ceiling of the optoelectronic packaging assembly 100 (e.g., VCSEL or photodiodes).

In other embodiments, other electronic components may be disposed on base 108 which assist in the functional operation of optoelectronic devices 102. Electronic components include, but are not limited to, resistors, capacitors, inductors, semiconductor die such as signal amplifiers, TIA amplifiers for photodiodes, and the like.

Base 108 includes means for placing the optoelectronic device 102 in electrical communication or connection with the printed circuit board 50 or other external component. The means for placing the optoelectronic device 102 in electrical connection with the printed circuit board 50 includes any metal, metal alloy or other conductive structure which assists directly or indirectly to establish an electrical pathway between the optoelectronic device 102 and the external component. Generally, the means for placing optoelectronic device 102 in electrical connection with the printed circuit board 50 is continuous from the optoelectronic device 102 to the point where the base 108 is placed in electrical contact with the printed circuit board 50.

Additionally, the means for placing optoelectronic device 102 in electrical connection with the printed circuit board 50 includes primarily surface mount technology structures.

In one embodiment, illustrated in FIG. 4, means for placing optoelectronic device 102 in electrical communication with printed circuit board 50 includes a ball grid array. The ball grid array includes a plurality of solder bumps or solder balls 122 which are arranged on the bottom of the base 108. The solder balls 122 provide input/output points for electrical communication going into and coming from packaging assembly 100. Advantageously, a ball grid array allows for a flexible number of solder balls 122 and also allows the solder balls to be arranged in full, perimeter, or staggered array configurations on the bottom of base 108. This allows for a high I/O density. Preferably, the solder balls are made from a high temperature material, for example, 90Pb/10Sn. More preferably, the solder balls are made of eutectic solder such as 37Pb/63Sn. Even more preferably, current "lead-free" technology is influencing the semiconductor industry to move to alloys having 5–7% Ag, 0.3–0.5% Cu and the balance Sn. The choice of the material of the solder balls may be decided based on whether the package is light or heavy. Alternatively, the solder material could be a solder alloy or other metal.

A plurality of through holes or vias 124 are transversely formed through base 108. Each via 124 is configured to receive and/or attach to a solder ball 122. In one embodiment, vias 124 are metallized which assists in bonding solder balls 122 to the base 108 through bonding processes such as, but not limited to, soldering, brazing, and the like. When solder balls 122 are bonded to vias 124 in this manner, the solder balls assist in providing a means for placing optoelectronic device 102 in electrical communication with printed circuit board 50.

The metallized vias 124 are hermetically sealed to the base 108 to provide mechanical and environmental protection for the optoelectronic devices contained in the packaging assembly 100. The hermetic seal between the metallized vias 124 and the base 108 may be created, for example, by using ceramic metallizing paste, glass-to-metal or other comparable hermetic insulating methods that are known in the art.

In addition, the solder balls 122 are placed in electrical communication with optoelectronic device 102. After optoelectronic device 102 is mounted to base 108, the cathode and anode portions of the optoelectronic device are connected to base 108 by wire bonding. That is, base 108 includes wire bond pads 126. Bonding wires 128 are connected from the optoelectronic device 102 to the bond pads 126. The bonding wires 128 can be wire-bonded via thermal, ultrasonic or thermosonic bonding to the optoelectronic device 102 and to the bond pads 126. Base 108 includes metal traces 130 formed thereon. The metal traces are formed during the fabrication of the base. Traces 130 are connected to bond pads 126 and extend to vias 124. The bonding wires 128, wire bond pads 126, and metal traces 130 complete the electrical pathway from vias 124 to optoelectronic device 102.

With reference to FIGS. 5 and 6, another embodiment for means for placing optoelectronic device 102 in electrical communication with printed circuit board 50 includes elongate leads 132 extending from base 108. Elongate leads 132 are connected to metal traces 130. In some embodiments, elongate leads 132 are formed continuously with metal traces 130. In the embodiment of FIG. 5, elongate leads 132 are bent in a "J" shape so that the curved portion of the "J" shape can be connected to the printed circuit board 50. These types of leads may be referred to as J-bend leads. In another embodiment, shown in FIG. 6, elongate leads 132 are bent outwardly to form legs that are configured to be connected to the printed circuit board 50. These type of leads may be referred to as gull-wing leads.

Preferably, the elongate leads 132 are insulated from the housing of the package to prevent the elongate leads from shorting when coming in contact with the housing. As shown in FIG. 5A, the elongate lead 132 is formed over the ceramic base 108. A ceramic insulation layer 133 is formed over the elongate lead 132. A metallization layer 135 is then applied over the insulation layer 133 to prepare it to accept solder. A solder 137 is then used to secure the housing of the package to the base 108, the solder being placed between the ceramic insulation layer and the housing 110. It will be appreciated that this feature may be applied to both embodiment shown in FIGS. 5 and 6. That is, FIGS. 5 and 6 shows the elongate leads 132 before a ceramic insulation layer is applied.

Further, FIG. 5 illustrates that slots 131 may be formed in the base 108 configured to receive an elongate lead 132. The slots 131 may then be filled with the ceramic insulation material 133 as shown in FIG. 5A, thus embedding the elongate leads 132 within the slots 131. This particular embodiment reduces the amount of ceramic insulation material required while still maintaining the elongate lead 132 from coming in contact with the housing.

In still another embodiment, not shown, means for placing the optoelectronic device in electrical communication with the printed circuit board includes a plurality of metal traces that conform to the sides of the base. The base is configured to be disposed in a chip carrier or chip socket, the chip carrier having elongate leads which are configured to electrically connect to the printed circuit board. The metal traces on the base align with the elongate leads on the chip carrier so that the metal traces are placed in electrical communication with the printed circuit board.

In yet another embodiment, not shown, through-hole stubs may be used to electrically connect the optoelectronic device to the external device. In this embodiment, leads intended for through-hole connections are cut very short and then "butt joint" soldered to the external device.

In one embodiment, the base may be constructed having a multi-layer configuration wherein metal traces are disposed between each layer. The metal traces may be in electrical communication using metallized vias or other lead structure.

Referring back to FIGS. 3 and 4, optoelectronic device 102 is maintained in an enclosure 109 to protect the optoelectronic device 102 from breakage, particulate contamination, and other abuse. Enclosure 109 also provides environmental protection to protect the optoelectronic device 102 from chemicals, moisture and gases that may interfere with the optoelectronic device's function. In a preferred embodiment, the enclosure 109 is hermetic. To provide hermeticity, enclosure 109 is formed using metal-to-ceramic joints, for example, by brazing or soldering. In a less preferred embodiment, a non-hermetic seal may be formed around enclosure 109 using epoxy resins and polyimides (a.k.a. plastic packages).

In one embodiment, enclosure 109 is formed from housing 110 and base 108. The shape and configuration of housing 110 may vary depending on design considerations. In one embodiment, housing 110 has a cap-like configuration in which one end or side is open such that the housing can rest on the top surface of base 108 and contain optoelectronic device 102 therein. This embodiment is illustrated in FIG. 4, wherein housing 110 is rectangular in shape with an open bottom side. Housing 110 includes a top surface 134, a front side 136, a rear side 138, a left side 140, and a right side 142. Preferably, base 108 includes a metallized perimeter 148 which is used for brazing or soldering (ie., glass sealing) housing 110 to base 108. When housing 110 is disposed on base 108, the boundary of the interior surface of housing 110 and the top surface of base 108 form enclosure 109. In one embodiment, the base 108 may include a welding flange, and the housing 110 includes a welding flange which is connected together by means known in the art such as, but not limited to, brazing, soldering, welding, and the like. Although less preferred, a non-hermetic enclosure can be formed using adhesive or epoxy or other mechanical structure. Alternatively, the outer periphery of base 108 could fit within the outer periphery of housing 110.

In another embodiment, housing 110 may have a rectangular or cylindrical configuration (or other polygonal configuration) which is completely enclosed except for one side wall which has a slot formed thereat. An end of base 108 is at least partially disposed in housing 110. Housing 110 may have a cubical or cylindrical structure with two end walls. One of the end walls includes a slot formed therein to receive the end of the base. The enclosure 109 is then formed by bonding the base and the housing at the slot.

In still another embodiment, housing 110 and base 108 form enclosure 109 with the assistance of additional structures. That is, housing 110 may have a cap-like configuration wherein an end of the base is disposed in the housing 110. The enclosure 109 can be formed by placing an additional support structure at the bottom periphery of the housing 110 and bonding the support structure to the housing and the base. These additional embodiments are described further below with reference to FIGS. 11 through 14.

Housing 110 may be made from Kovar® or other suitable metal having a a thermal coefficient of expansion (TCE) similar to alumina, glass or silicon. Kovar® is a highly magnetic iron-nickel-cobalt alloy exhibiting a desired thermal coefficient of expansion. As such, it is particularly useful in glass-to-metal seals. In addition, Kovar® has thermal characteristics similar to aluminum. However, housing 110 may be made from any suitable material which provides the hermeticity desired in packaging assembly 100 and provides sufficient bonding between housing 110, base 108, and/or other support structures. Other suitable materials include, but are not limited to, alloy 42, which is an iron nickel alloy, cold-rolled steel, or Vacon VCF-25 Alloy.

Referring to FIG. 4, housing 110 also includes a transparent optical portion or window 146 disposed in one of the sides thereof. In the embodiment of FIG. 4, window 146 is disposed in the front side 136 of housing 110. Window 146 is constructed of any material which maintains the hermeticity in packaging assembly 100 and has sufficient transparency to allow optical radiation to enter and/or exit housing 110. In one embodiment, window 146 is constructed of glass. In another embodiment, the window 146 material is a borosilicate glass with anti-reflective coating. Less preferably, window 146 could also be constructed of a suitable plastic. Window 146 may have any shape required for design considerations; for example, window 146 may have a circular, square, rectangular, or other polygonal shape. Window 146 could also be hemispherical or "mushroom" shaped (not shown), in which case it could act as both a focusing lens and a transparent seal. The existence of window 146 also makes Kovar® a preferred material to form housing 110, as it provides that window 146 can be sealed to housing 110 using a matched or compression glass-to-metal seal and still provide the hermeticity required.

Figure 7:
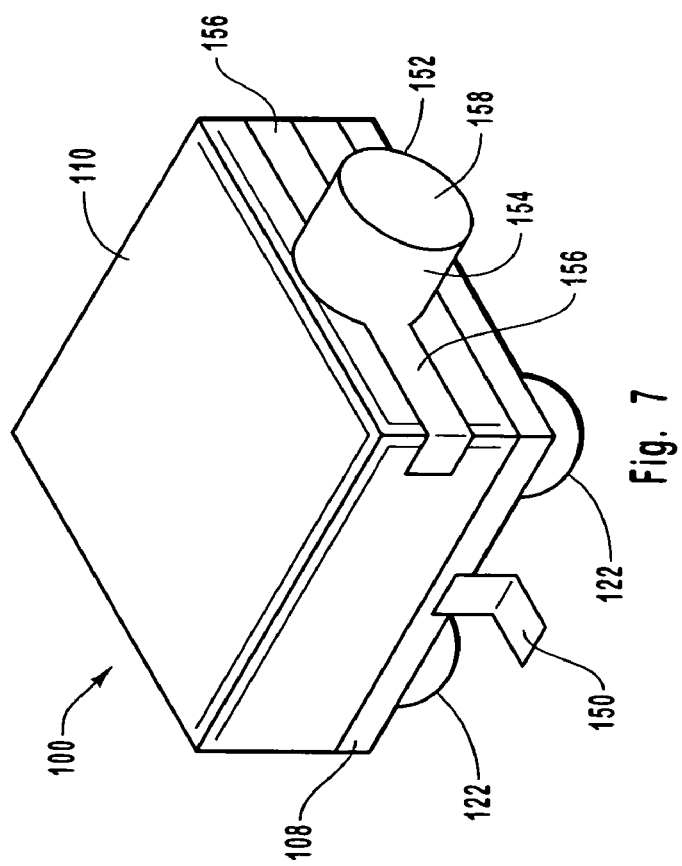
FIG. 7 is a perspective view of an embodiment of a packaging assembly of the present invention illustrating structures for mechanically attaching the packaging assembly to a printed circuit board and a TOSA or ROSA port.

Means are provided for mechanically connecting packaging assembly 100 to the printed circuit board 50. As shown in FIG. 7, one such means for connecting packaging assembly 100 to printed circuit board 50 includes a set of support or connector tabs 150 disposed on opposing sides of housing 110 or base 108. Connector tabs 150 may be glued, welded, brazed, or soldered, or otherwise connected to printed circuit board 50. As such, packaging assembly 100 can be mechanically connected to printed circuit board without relying on the means for placing optoelectronic device 102 in electrical communication with printed circuit board 50; indeed the primary purpose of the means for placing optoelectronic device 102 in electrical communication with printed circuit board 50 is to provide electrical connection between packaging assembly 100 and printed circuit board 50. However, means for placing optoelectronic device 102 in electrical communication with printed circuit board 50 (e.g., solder balls 122, J-shaped or bent leads 132) may also be construed as forming means for mechanically connecting packaging assembly 100 to printed circuit board 50.

Figure 8:
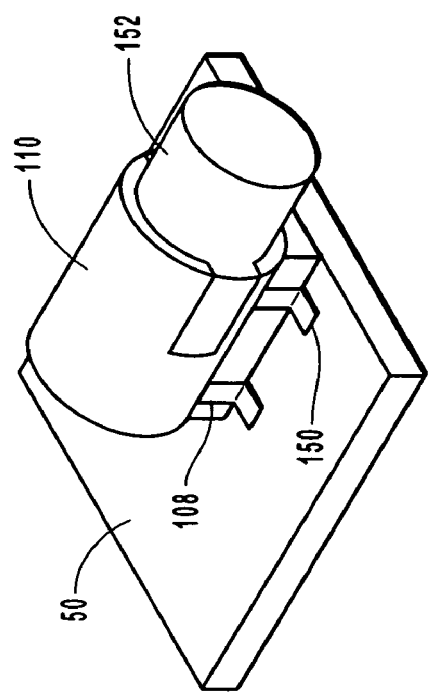
FIG. 8 is a perspective view of another embodiment of the packaging assemblies of the present invention.

As shown in FIG. 8, housing 110 can be configured to be cylindrical instead of square or rectangular. This may facilitate connection to and/or alignment with a TOSA/ROSA port, described in more detail below.

Assembly of packaging assembly 100 generally includes the following steps; however, the methods of making packaging assembly 100 are not limited to the particular order of the following steps, may skip particular steps, and/or may include additional steps not disclosed herein, but understood to those skilled in the art.

The optoelectronic device can be constructed by semiconductor manufacturing means known in the art. The wafer containing the diode is separated into individual optoelectronic devices by sawing, slicing, scribing, laser or other break techniques and other techniques known in the art.

The base 108 is prepared by forming the base in the desired shape from a ceramic or other material. Suitable structures for connecting the optoelectronic device to base are formed such as, but not limited to, vias, stepped regions, or recessed regions. In addition, suitable structures for attaching means for placing the base in electrical communication with the external component are formed. For example, vias are formed in the base for attaching solder balls thereto. The vias may have metallizing paste for connecting to the solder balls. The ceramic base is then fired in a furnace.

The metal traces, vias and pads are generally formed during fabrication of the base. A standard LTCC ceramic metallizing process may be used which involves forming a paste made of blended ceramic and metal components and printing the paste onto the unfired alumina ceramic substrate. As the ceramic sinters in a high temperature oven, the paste bonds to the ceramic and also forms a "mostly" metal layer on the surface which is conductive. After firing, the pads are nickel plated and/or gold plated to allow soldering or wire bonding.

In the embodiment incorporating stepped or recessed regions, the stepped or recessed areas on the base 108 can be formed by pressing and sintering alumina ceramic into the desired shape. Thus, various structures, for example, the post 106 could be formed integrally with the base. Precision engineering would be required to line up the stepped region and die with the window so that the laser light can exit or the focused fiber light can enter the window to hit the active area of the die. Advantageously, this could decrease assembly costs. In addition, it has the potential to reduce the impedance of electrical paths.

The solder ball or lead system is then formed. Forming the solder ball or lead system includes connecting solder balls, J-shaped leads, or bent leads to the base. In the embodiment having solder balls, the solder balls would be attached to the so external pads by fluxing the gold plated pads, adding the balls, and then reflow soldering the balls to the external pads. In the embodiment having external leads, as discussed above, insulating layers may be formed over portions of the lead system to separate the leads from direct contact with the housing.

The optoelectronic device is then attached to the base by brazing or soldering. For example, a gold-silicon solder may be used to connect the optoelectronic device to base 108.

Bonding wires are then connected between the optoelectronic device bonding pads and the wire bonding pads on the base 108. This includes wire bonding of the signal, power and ground connections to the die. Bonding may be done by means known in the art such as flip chip bonding, bump bonding, or the TAB technique.

The housing 110 can be subsequently, simultaneously, or pre-formed. The housing can be formed by stamping a metal material into the desired shape. The window is then added to the housing. The window is sealed to the housing preferably by glass-to-metal sealing, and can be sealed in an oven.

After the housing is formed, the housing and base are connected and sealed together using known sealing methods, such as welding, soldering, brazing, and the like, all of which produce a hermetic seal. Less preferably, the housing is connected to the base using non-hermetic methods such as adhesive or epoxy or simple mechanical connections such as miniature rivets.

After the housing and base are connected, the solder balls or outer leads may be plated with an additional layer of conductive metal to improve the connection between the housing and base and the package to the printed circuit board. Where outer leads include J-shaped leads or bent leads, the leads may be trimmed or bent as necessary to provide connection to the printed circuit board.

In addition, in some embodiments, connector tabs may be added to the outside of the housing and/or base, either during manufacture of the housing and/or base or after the package is formed.

After formation of the package, the package can be connected to the printed circuit board using known soldering or spot welding techniques. In addition, reflow soldering techniques may also be used to connect the packaging assembly to the printed circuit board.

With reference to FIGS. 7 through 10, the completed packaging assembly 100 is able to be connected to a Transmitter Optical Subassembly (TOSA) attachment to form an optical transmitter for use in optoelectronic devices, such as a transceiver. Alternatively, the packaging assembly 100 may be used with a Receiver Optical Subassembly (ROSA) to form an optical receiver that may be used in a transceiver. Packaging assembly 100 may include an adapter 152 which includes a connector portion 154, and connector tabs 156. Connector portion 154 is configured to be received inside a TOSA port. Connector tabs 156 are configured to be connected to housing 110 of packaging assembly 100.

Figure 9:
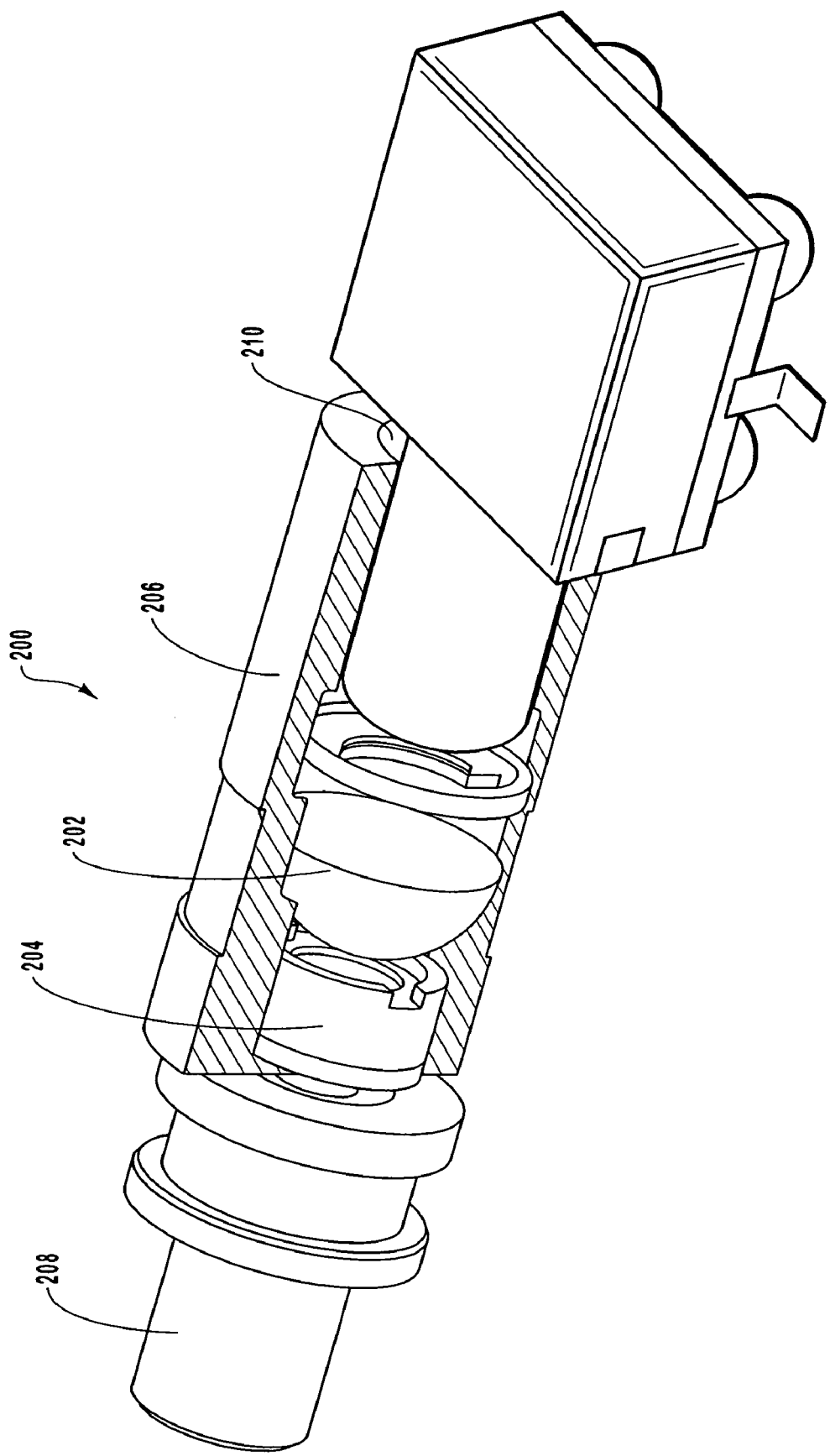
FIG. 9 is a perspective view of one embodiment for attaching the packaging assemblies of the present invention a TOSA/ROSA port.

The TOSA 200 as shown in FIG. 9 is capable of producing a modulated optical signal for transmission via an appropriate waveguide, such as a fiber optic cable. Such optical signals are used, for instance, in optical communications networks for high speed transmission of data. The TOSA 200 comprises a lens assembly 202, an isolator 204, an outer casing 206, and a receptacle 208. Outer casing 206 forms a port 210 configured to receive a portion of packaging assembly 100 or an adapter configured to allow packaging assembly 100 attach to TOSA 200. As shown in FIG. 9, preferably, the cross section of connector portion 154 of adapter 152 corresponds to the cross-section of the port 210 of outer casing 206 such that they matingly engage when assembled. The TOSA 200 can be aligned with packaging assembly 100 using known active laser alignment methods. Finally, the packaging assembly 100 can be permanently connected to the TOSA 200 using, for example, adhesive, or tack welding.

While a receiver optical subassembly (ROSA) contains different components, it will be appreciated that a packaging assembly 100 having the appropriate optoelectronic device 102 can be used to form a ROSA for use in a transceiver assembly.

Figure 10:
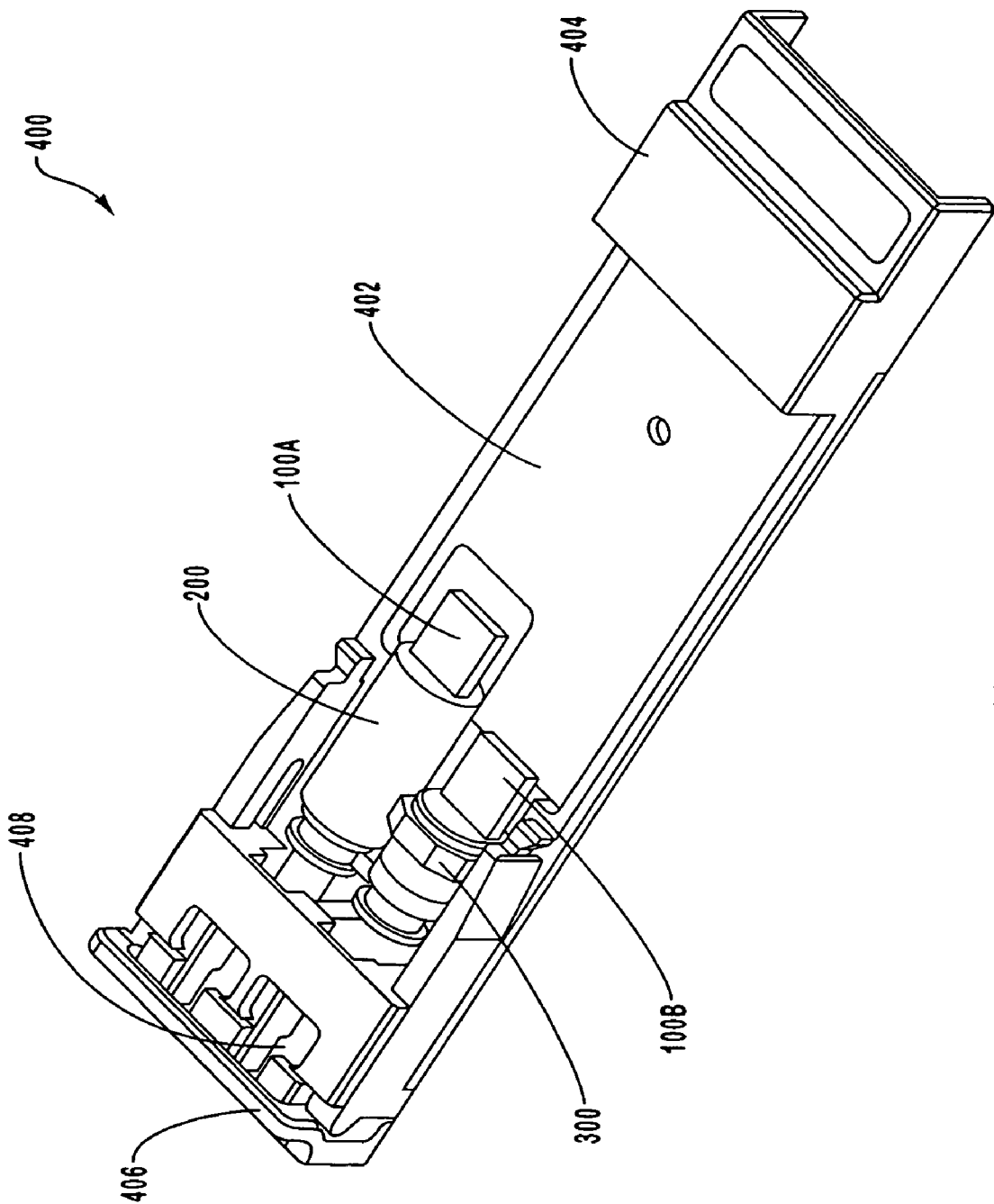
FIG. 10 is a perspective view of one embodiment for forming a transceiver module using packaging assemblies of the present invention.

As shown in FIG. 10, a TOSA 200 and ROSA 300 are shown assembled in a transceiver module 400. In one embodiment, the transceiver is a small form factor optical transceiver module configured to meet a particular standard, such as the XFP standard. As depicted in FIG. 10, transceiver module 400 includes TOSA 200, ROSA 300, and a printed circuit board 402. Also depicted as part of module 400 are housing 404 for containing the electrical components of module 400, bail release 406 and LC cable receptacles 408 for receiving and securely attaching LC cables to TOSA 200 and ROSA 300. TOSA 200 and ROSA 300 include packaging assemblies 100A and 100B containing features described above.

With reference to FIGS. 11 through 14, another embodiment for packaging assemblies will now be described. The packaging assembly 500 is similar to the packaging assembly 100. Packaging assembly 500 focuses on the embodiment described above where an end of the base is received in the enclosure 509. The enclosure 509 containing the optoelectronic device can be formed by the housing and base with or without additional structures. Packaging assembly 500 may be useful to better align the packaging assembly with a TOSA or ROSA port. In one embodiment, packaging assembly 500 can be used in a side-emitting configuration.

Packaging assembly 500 generally includes a housing 502 and a receiving assembly 506 which both cooperate to support a base 504. An end of base 504 is horizontally disposed in housing 502 and the other end of the base is disposed in receiving assembly 506. FIGS. 11A and 11B illustrate two embodiments for housing 502—one in which the housing is a cap-like structure and the other where the housing is a closed structure with a slot to receive the base. FIGS. 11A and 11B also illustrate two embodiments for receiving assembly 506—one where the receiving assembly is two discrete portions and the other where the receiving assembly is a single integral structure. In addition, as described further below, housing 502 and receiving assembly 506 can be integrally formed from a single structure.

Figure 12B:
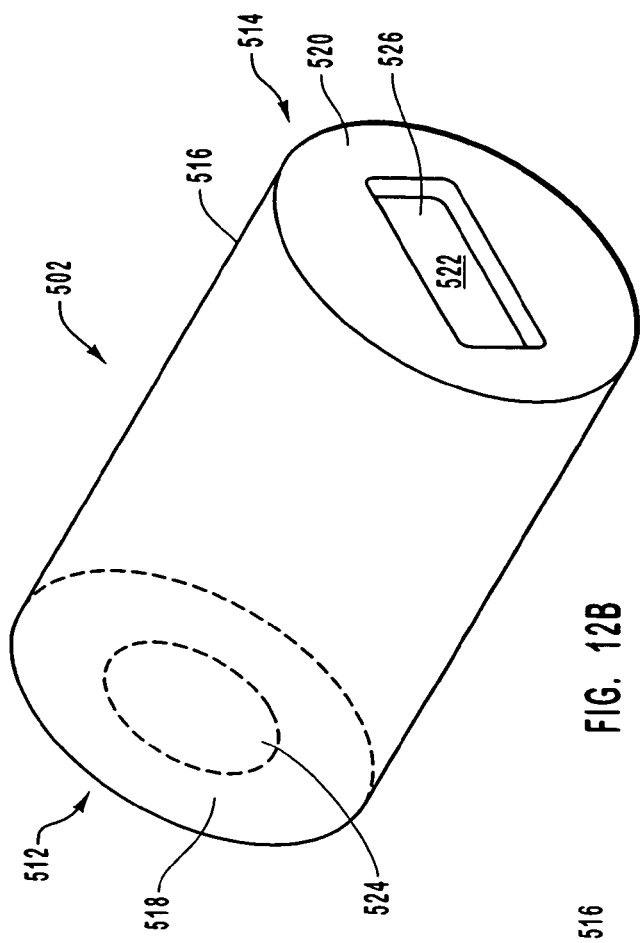
FIGS. 12A and 12B is the housing of the embodiments of FIGS. 11A and 11B.
Figure 12A:
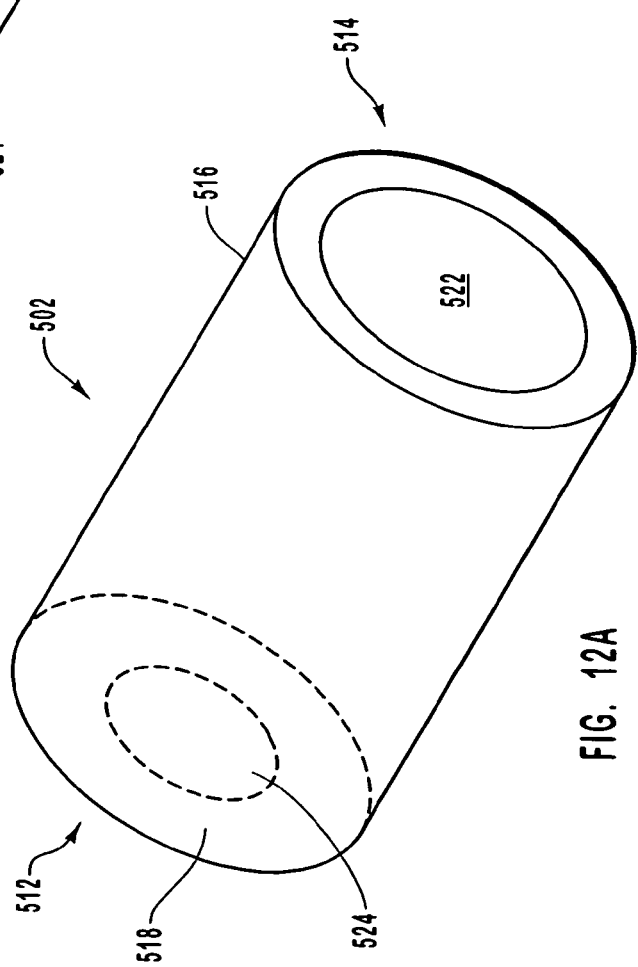

With reference to FIGS. 12A and 12B, housing 502 is shown in greater detail. As shown in FIG. 12A, housing 502 has a first end 512, a second end 514 and a sidewall 516 extending therebetween. Housing 502 includes an end wall 518 at first end 512. Sidewall 516 and end wall 518 bound a chamber 522, which, when packaging assembly 500 is fully assembled, preferably cooperates with receiving assembly 506 and base 504 to form an enclosure 509. End wall 518 includes a transparent portion or window 524 which can be configured similar to that for window 146 of packaging assembly 100.

In the embodiment of FIG. 12B, housing 502 includes an end wall 520 at second end 514. End wall 520 includes a slot 526 formed therethrough sized and configured to receive base 504. End wall 520 and base 504 can be bonded together to form an enclosure 509. Additionally, slot 526 aligns with a corresponding slot in receiving assembly 506 and end wall 520 can be bonded to a corresponding end wall of receiving assembly 506.

Housing 502 can be constructed of the same material as housing 110. Housing 502 is shown as cylindrical in shape in order to matingly engage with a port for a TOSA/ROSA, similar to those shown in FIGS. 9 and 10. However, housing 502 may be any suitable shape, such as rectangular. Preferably, housing 502 is configured to matingly engage with a corresponding TOSA/ROSA.

Figure 13:
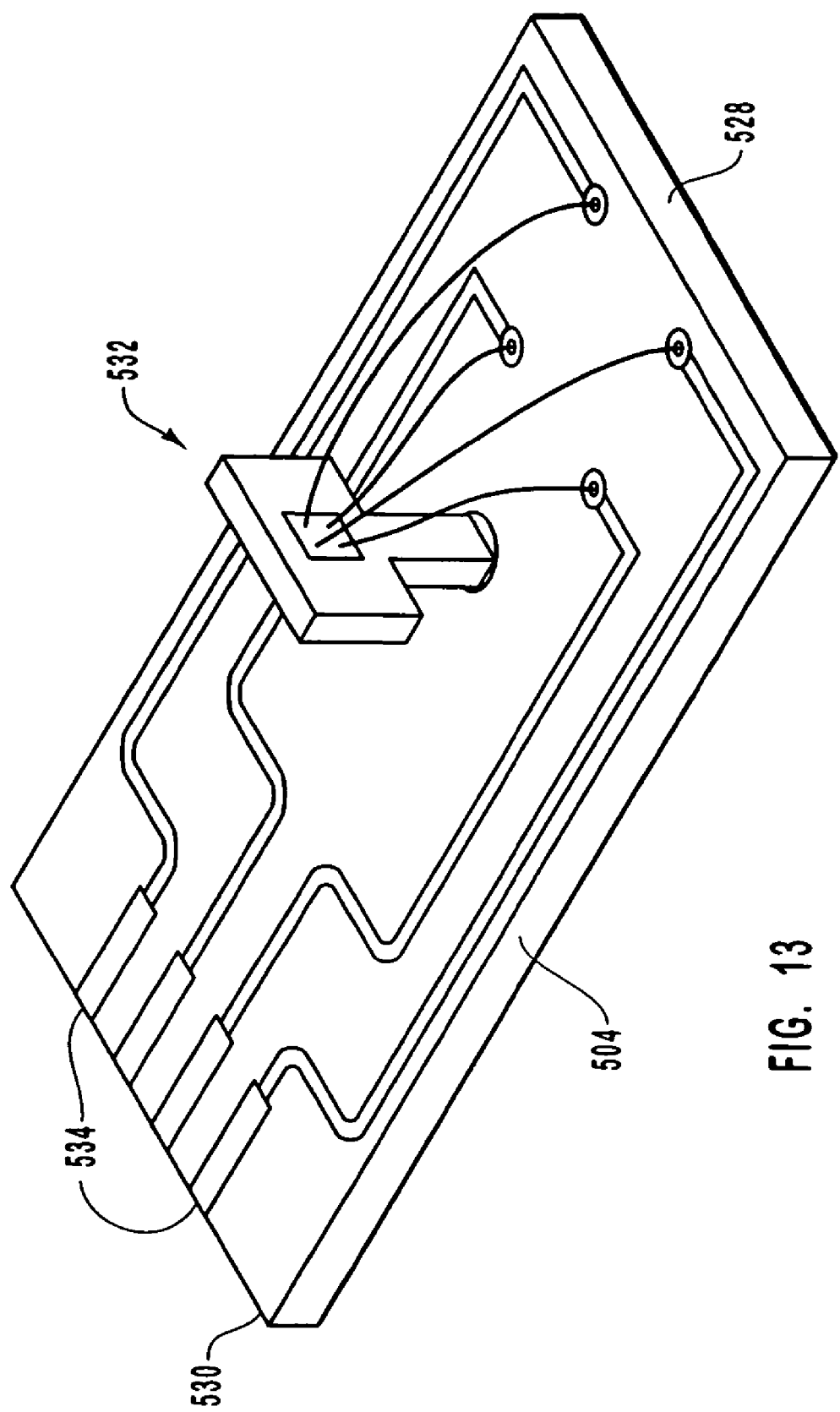
FIG. 13 is a perspective view of yet another embodiment of the base of the packaging assemblies having electrical pads formed thereon.

As shown in FIG. 13, base 504 is shown in more detail. Base 504 has a first end 528 and a second end 530. Base 504 is configured to be connected to an optoelectronic device 532. Base 504 and optoelectronic device 532 can be constructed substantially similar to base 108 and optoelectronic device 102 of packaging assembly 100. Preferably, optoelectronic device 532 is placed near one end of base 504 so that that end of the base can be placed within housing 502. During assembly, first end 528 of base 504 is disposed in housing 502 while the second end 530 is disposed in receiving assembly 506.

Means are provided for connecting the optoelectronic device 532 to base 504. Such means can be substantially similar to those described with respect to packaging assembly 100.

Means are provided for placing base 504 in electrical communication with an external component. Such means include the wire and lead system connecting optoelectronic device 532 to base 504. This may include bonding wires, wire bond pads and metal traces as discussed with reference to packaging assembly 100. In addition, means for electrically connecting base 504 to an external component include electrical pads 534 which are connected to the metal traces. Electrical pads 534 are used to electrically connect to an external component. After the metal traces and wire bonding is formed, in one embodiment, base 504 is covered with a dielectric insulative material except at electrical pads 534.

As discussed above, receiving assembly 506 may have various configurations depending on design considerations. In the embodiment of FIG. 11A, receiving assembly 506 comprises discrete portions 508a, 508b. A gap 510 is formed between portions 508a, 508b. Gap 510 is configured to receive a portion of base 504. When base 504 is disposed in gap 510, receiving assembly 506 is configured to assist in electrically connecting an external component, such as a printed circuit board, to the base. FIG. 1B is similar to FIG. 1A, but shows receiving assembly 506 as a single structure, having portions 508a, 508b formed therefrom. Similar to above, portions 508a, 508b form a gap 110 configured to receive base 504 and an external component.

With reference to FIGS. 14A and 14B, receiving assembly 506 is described in further detail. The receiving assembly 506 acts to support the second end 530 of base 504. In addition, receiving assembly 506 provides reinforcing strength to the external component when packaging assembly 500 is fully assembled. Receiving assembly 506 includes a first end 536 and a second end 538. In one embodiment, the circumference of receiving assembly 506 has a geometric configuration similar to housing 502. As such, first end 536 of receiving assembly 506 is configured to be connected to second end 514 of housing 502. Housing 502 can be connected to receiving assembly 506 by any suitable hermetic means such as welding, brazing, soldering, and the like. Less preferably, housing 502 may be connected to receiving assembly 506 by non-hermetic means including adhesive, epoxy or mechanical structures. Alternatively, receiving assembly 506 may be a different geometric configuration than housing 502, so long as housing 502 is able to be connected to a TOSA/ROSA port.

In the embodiment of FIG. 14A, receiving assembly 506 can be formed from two discrete portions—a top portion 508a and a bottom portion 508b. Both portions 508a, 508b have a substantially hemispherical shape. The top portion 508a has a wall 542 at the first end 536 which extends downwardly from the portion. Wall 542 provides a stopping structure for an external component. Wall 542 is only required in embodiments where housing 502 has a cap-like configuration in order to maintain the hermeticity of enclosure 509. In embodiments where end wall 520 of housing 502 has a slot-configuration, wall 542 is not necessary, the stop mechanism for the external component being provided by the end wall 520. In this situation, portions 508a, 508b would thus have hemispherical cross-sections the entire length thereof. Portions 508a, 508b form a gap 510 therebetween. Gap 510 is configured to receive base 504 and also an external component.

In the embodiment of FIG. 14B, receiving assembly 506 is formed as an integral structure. In this embodiment, receiving assembly 506 has a body 507 having portions 508a, 508b formed at the second end 538 thereof. Portions 508a, 508b thus extend along a partial length of the body 507 of receiving assembly 506 and form a gap 510 therebetween. At the termination of portions 508a, 508b is a wall 542. A slot 540 is formed between first end 536 and wall 524 of the body 507. Thus, slot 540 is continuous with gap 510. Slot 540 is configured to receive only the base 504. Wall 542 provides a stop mechanism for an external component.

While housing 502 and receiving assembly 506 have been described as being discrete sections, FIG. 11B shows that housing 502 and receiving assembly 506 may be integrally formed. For example, housing 502 and receiving assembly 506 may be constructed of a single piece of rod stock. A cavity 509 is reamed into the rod stock up to the midpoint between the housing portion and receiving assembly portion. A slot is then reamed in the back wall of the housing portion 502 such that a continuous slot is formed (represented by slot 526 (FIG. 12B) and slot 540 (FIG. 14B)). Next a slot 510 is cut across the diameter of the receiving assembly 506 to divide it into two portions 508a, 508b. The slot 510 is milled until it reaches the rectangular slot 540 to complete the opening in the middle wall. The ceramic base 504 may have a metallized ring around the perimeter thereof so that it can be solder sealed to the slot 526, 540 thus providing a hermitic joint. After the ceramic base 504 has been disposed into the slot 526, 540 and solder sealed, the window 524 is soldered or welded to the front end of housing 502.

The embodiments of receiving assembly 506 may be formed by any suitable manufacturing process. For example, receiving assembly 506 may be machined from a rod stock or formed by a stamping method. Receiving assembly 506 can be any material such as metal, metal alloys, ceramic, plastic, composite, and the like so long as it provides sufficient strength to support base 504 and an external component when connected to housing 502.

The assembly of packaging assembly 600 may occur as follows: base 504 is formed using known manufacturing processes. A via(s) may be formed in base 504 before firing. The via(s) may be metallized. Traces are formed on a top surface of base 504. Wire bond pads and electrical pads 534 may be formed on the top surface of the base 504 in electrical communication with metal traces. The base is then fired.

One end of base 504 can then be disposed in a premanufactured housing 502. In the embodiment where housing 502 does not have an end wall 520, the optoelectronic device 532 can be connected to base 504 before placing the ceramic base in the housing. In the embodiment where housing 502 does have an end wall 520, base 504 may be disposed through slot 526 and the optoelectronic device 532 connected to the ceramic base through the space intended for window 524. Window 524 may then be bonded to housing 502.

Receiving assembly 506 is then attached to the packaging structure. In the embodiment where receiving assembly 506 is two discrete portions 508a, 508b, these portions can then be bonded to base 504 and housing 502. In the embodiment where receiving assembly 506 is a single integral member, the receiving assembly is carefully disposed over base 504 such that the electrical pads 534 are not harmed when fitting the ceramic base inside receiving assembly 506. Receiving assembly 506 is then bonded to housing 502 and/or base 504. Preferably the interface between housing 502, receiving assembly 506, and/or base 504 is hermetically sealed or bonded using glass-metal sealing structures such as, but not limited to, soldering, brazing, and the like. Less preferably, they are sealed using non-hermetic means such as epoxy, adhesive, and/or mechanical structures.

Similar steps or additional ones understood by those of skill in the art may be taken in forming a packaging having a housing 502 and receiving assembly 506 which are integrally formed.

As shown in FIG. 15A, the packaging assembly 500, is configured to be connected to an external component, such as a printed circuit board 544. As discussed above, receiving assembly 506 is configured with a gap 510. Preferably, gap 510 is configured to receive base 504 and printed circuit board 544 with a tight tolerance. Thus, printed circuit board 544 is held within gap 510 somewhat by friction. Preferably, the friction force is tight enough that additional structure are not required to attached packaging assembly 500 to printed circuit board 544. In one embodiment, metal spring tabs may be soldered to the base in order to assist in the electrical connection and physical connection of the external component to the packaging of FIG. 11B. The spring tabs would provide a friction force to the printed circuit board as well as provide electrical connections thereto.

Housing 502 of packaging assembly 500 is preferably configured to be connected to a TOSA/ROSA port similar to that shown with regard to FIGS. 9 and 10. In the embodiment where packaging assembly 500 is cylindrical, it is easier to align for use in center-line applications. One example is for use in small form factor Multi-layer Serial Link (MSL™) applications.

FIG. 15B illustrates another embodiment of a packaging assembly 600. Packaging assembly 600 is substantially similar to packaging assembly 500 so like elements will be referred to with like reference numerals. However, packaging assembly 600 includes a top base 602a and a bottom base 602b. Bases 602a, 602b are substantially parallel and spaced apart from each other. Bases 602a, 602b are constructed substantially similar to base 504 in packaging assembly 500.

Each base 602a, 602b contains at least a portion of the structures required to provide means for electrically connecting bases 602a, 602b to optoelectronic device 532. That is, both bases 602a, 602b may include bonding pads, metal traces, and/or electrical pads 534. In addition, on or more metal posts 604 may be disposed between bases 602a, 602b. Metal posts 604 are used to interconnect the electrical structures of bases 602a, 602b.

Packaging assembly 600 can be assembled similar to that described above with the electrical structures on bases 602a, 602b facing each other. As shown in FIG. 15B, printed circuit board 544 will be in contact with electrical pads 534 on both sides thereof. As such, printed circuit board 544 preferably has corresponding electrical structures on both sides. In addition, because bases 602a, 602b are spaced apart, a sealing member 606 (which may be constructed from the same material as the receiving assembly) is vertically disposed between bases 602a, 602b and hermetically sealed with the bases and housing. As such, a hermetic enclosure can still be formed in packaging assembly 600.

Advantageously, the packaging assemblies of the present invention benefit from many of the features of surface mount technology. Benefits include the fact that surface mount technology allows components to be loaded on one side of a printed circuit board, leaving the other side free for additional components to be loaded and bonded thereto. Surface mount technologies are easier to automate than other fabrication technologies. In addition, using surface mount technology in conjunction with the optoelectronic devices herein, provides a simpler means of connecting an optoelectronics package to an external component than other methods such as flexible circuits or through-hole leaded packages.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical transceiver module for use in optical communications networks, comprising:
   a printed circuit board;
   a receiver optical subassembly ("ROSA"); and
   a transmitter optical subassembly ("TOSA"), the TOSA comprising:
      an outer casing having a first end and a second end;
      a receptacle attached at a first end of the outer casing; and
      an optoelectronic packaging assembly attached at a second end of the outer casing, the optoelectronic packaging assembly comprising:
         an optoelectronic device mounted on a post;
         an enclosure configured to receive the optoelectronic device comprising:
            a base having a via formed therein, wherein the post is disposed in the via;
            a housing having a view port configured to allow the optoelectronic device to send or receive optical signals therethrough, wherein the post is bonded to the via such that the post aligns the optoelectronic device with the view port; and
         means for placing the base in electrical communication with the external component using surface mount technology.

2. The transceiver as recited in claim 1, wherein the enclosure is hermetic.

3. The transceiver as recited in claim 1, wherein the enclosure further comprises a receiving assembly and the base further comprises a first end and a second end, wherein the first end of the base is disposed in the housing and the second end of the base is disposed in the receiving assembly.

* * * * *